US009316711B2

(12) United States Patent
Reeder et al.

(10) Patent No.: US 9,316,711 B2
(45) Date of Patent: Apr. 19, 2016

(54) SYSTEM AND METHOD FOR ACCELERATED MAGNETIC RESONANCE IMAGING USING SPECTRAL SENSITIVITY

(75) Inventors: Scott B Reeder, Middleton, WI (US); Matthew R Smith, Verona, WI (US); Nathan S Artz, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 896 days.

(21) Appl. No.: 13/568,511

(22) Filed: Aug. 7, 2012

(65) Prior Publication Data
US 2014/0043023 A1 Feb. 13, 2014

(51) Int. Cl.
*G01R 33/561* (2006.01)
*G01R 33/44* (2006.01)

(52) U.S. Cl.
CPC ............ *G01R 33/445* (2013.01); *G01R 33/561* (2013.01)

(58) Field of Classification Search
CPC ........................... G01R 33/445; G01R 31/561
See application file for complete search history.

(56) References Cited

U.S. PATENT DOCUMENTS

| | | | | |
|---|---|---|---|---|
| 7,768,264 | B1 * | 8/2010 | Brau ................... | G01R 33/5611 324/307 |
| 7,777,485 | B2 * | 8/2010 | Dumoulin ............ | G01R 33/287 324/307 |
| 7,944,206 | B2 * | 5/2011 | Frydman ............ | G01R 33/4822 324/307 |
| 2012/0268127 | A1 * | 10/2012 | Cunningham ....... | G01R 33/285 324/309 |

OTHER PUBLICATIONS

Artz, et al., Spectrally Resolved Fully Phase-Encoded 3D Fast Spin-Echo for Metal Artifact Reduction and Spectroscopic Imaging, Proc. Intl. Soc. Mag. Reson. Med., 2012, 20:2431.

Balcom, et al., Single-Point Ramped Imaging with T1 Enhancement (SPRITE), Journal of Magnetic Resonance, Series A, 1996, 123(1)131-134.

Busse, et al., Fast Spin Echo Sequences with Very Long Echo Trains: Design of Variable Refocusing Flip Angle Schedules and Generation of Clinical T2 Contrast, Magnetic Resonance in Medicine, 2006, 55(5):1030-1037.

Griswold, et al., Generalized Autocalibrating Partially Parallel Acquisitions (GRAPPA), Magnetic Resonance in Medicine, 2002, 47:1202-1210.

(Continued)

*Primary Examiner* — Dixomara Vargas
(74) *Attorney, Agent, or Firm* — Quarles & Brady, LLP

(57) ABSTRACT

A system and method for accelerated magnetic resonance imaging (MRI) using spectral sensitivity information are provided. The MRI system is used to acquire k-space data from a subject that when positioned in the main magnetic field of the MRI system causes inhomogeneities in the main magnetic field. Spectral sensitivity information is derived from the acquired k-space data. In general, the spectral sensitivity information relates specific resonance frequencies to distinct spatial locations in the main magnetic field of the MRI system. One or more images of the subject may be reconstructed from the acquired k-space data using the produced spectral sensitivity information to spatially encode the acquired k-space data. By using the spectral sensitivity information to provide spatial-encoding, the data acquisition can be accelerated, for example, by undersampling k-space. In addition, using the provided system and method, clinically viable images can be obtained in the presence of severe off-resonance.

16 Claims, 4 Drawing Sheets

(56) References Cited

OTHER PUBLICATIONS

Hayter, et al., Magnetic Resonance Imaging of the Postoperative Hip, Journal of Magnetic Resonance Imaging, 2012, 35(5):1013-1025.

Hernando, et al., Joint Estimation of Water/Fat Images and Field Inhomogeneity Map, Magnetic Resonance in Medicine, 2008, 59:571-580.

Koch, et al., A Multispectral Three-Dimensional Acquisition Technique for Imaging Near Metal Implants, Magnetic Resonance in Medicine, 2009, 61(2):381-390.

Koch, et al., Magnetic Resonance Imaging Near Metal Implants, Journal of Magnetic Resonance Imaging, 2010, 32 (4):773-787.

Koch, et al., Imaging Near Metal with a MAVRIC-SEMAC Hybrid, Magnetic Resonance in Medicine, 2011, 65:71-82.

Koch, et al., Frequency Encoding in the Presence of Extreme Static Field Gradients, Proceedings of the International Society of Magnetic Resonance in Medicine, 2011, 19:293.

Lu, et al., SEMAC: Slice Encoding for Metal Artifact Correction in MRI, Magnetic Resonance in Medicine, 2009, 62 (1):66-76.

Lustig, et al., SPIRIT: Iterative Self-Consistent Parallel Imaging Reconstruction from Arbitrary k-Space, Magnetic Resonance in Medicine, 2010, 64(2):457-471.

Ramos-Cabrer, et al., MRI of Hip Prostheses Using Single-Point Methods: In Vitro Studies Towards the Artifact-Free Imaging of Individuals with Metal Implants, Magnetic Resonance Imaging, 2004, 22(8):1097-1103.

Reeder, et al., Multicoil Dixon Chemical Species Separation with an Iterative Least-Squares Estimation Method, Magnetic Resonance in Medicine, 2004, 51:35-45.

\* cited by examiner

SYSTEM AND METHOD FOR ACCELERATED MAGNETIC RESONANCE IMAGING USING SPECTRAL SENSITIVITY

STATEMENT REGARDING FEDERALLY SPONSORED RESEARCH

This invention was made with government support under DK083380 and DK088925 awarded by the National Institutes of Health. The government has certain rights in the invention.

BACKGROUND OF THE INVENTION

The field of the invention is systems and methods for magnetic resonance imaging ("MRI"). More particularly, the invention relates to systems and methods for accelerating MRI by making use of spectral sensitivity.

Magnetic resonance imaging ("MRI") of non-ferrous metallic implants is challenging because of the substantial inhomogeneity induced in the $B_0$ magnetic field of the MRI system. This inhomogeneity leads to severe off-resonance in nearby tissue and distorts conventional spatial-encoding mechanisms. The image artifacts resulting from the off-resonance can significantly degrade the diagnostic quality of an image, making clinical diagnoses in the presence of metal very challenging.

Methods such as view angle tilting ("VAT"), slice-encoding for metal artifact correction ("SEMAC"), and multi-acquisition variable-resonance image combination ("MAVRIC") have been developed in an attempt to mitigate the off-resonance artifacts surrounding metallic implants. These methods are described, for example, by K. M. Koch, et al., in "Magnetic Resonance Imaging Near Metal Implants," *J Magn Reson Imaging*, 2010; 32(4):773-787.

Due to hardware limitations, a single radio frequency ("RF") pulse is often incapable of exciting the wide range of frequencies near metal. To cover this broad spectrum of frequencies, methods such as MAVRIC utilize multiple acquisitions, each with an RF pulse at different center frequency offsets. Therefore each acquisition produces images with a unique spectral sensitivity pattern. These "spectral" images can then be combined to generate a composite image with signal from all the frequencies. Although MAVRIC is capable of mitigating artifacts caused by large perturbations in the $B_0$ field, it requires long scan times and is, thereby, limited in spatial resolution.

MAVRIC can make use of a number of techniques to reduce the scan time, such as interleaving different RF excitations, partial Fourier, parallel imaging with multiple independent RF coils, and adaptive phase encoding. Adaptive phase encoding employs an effective undersampling by reducing the field-of-view ("FOV") for the high frequency spectral bins. Significant scan time reduction is possible with this approach, but it requires that the off-resonance is centrally located in the imaging field of view and has a limited spatial constraint. Therefore, a priori knowledge of the susceptibility position and spatial extent is required.

In addition to lengthy scan times, MAVRIC also utilizes a frequency-encoding (readout) gradients, which fundamentally limits its ability to eliminate in-plane signal loss and pile-up. While VAT and Jacobian methods help reduce in-plane signal loss and pile-up errors near metal, signal loss is unavoidable when the local $B_0$ gradient within a voxel exceeds the readout gradient, such as in tissue directly adjacent to a metal object. MAVRIC also uses a high readout bandwidth in combination with narrow spectral excitation bins to mitigate, but not eliminate, errors due to frequency encoding; however, this results in a reduction of signal-to-noise ratio ("SNR"). In addition, using a narrow RF excitation bandwidth requires a greater number of acquisitions to excite the same range of off-resonance frequencies.

Single point imaging ("SPI") techniques encode k-space one point at a time by eliminating frequency-encoding gradients and have been previously proposed in an effort to produce distortion-free images in the presence of off-resonance. This effort, however, has not gained traction because of prohibitively long scan times associated with SPI methods. A recent SPI method that is capable of spectrally-resolved, purely phase-encoded three-dimensional acquisitions was recently proposed, as described in co-pending U.S. patent application Ser. No. 13/451,773, filed on Apr. 20, 2012, entitled "System and Method for Spectrally-Resolved Three-Dimensional Magnetic Resonance Imaging Without Frequency-Encoding Gradients," and which is herein incorporated by reference in its entirety.

Thus, there remains a need for a system and method for magnetic resonance imaging that is capable of accelerating data acquisitions in the presence of severe off-resonances, such as those caused by magnetic field inhomogeneities induced by a metallic object.

SUMMARY OF THE INVENTION

The present invention provides a method for accelerated magnetic resonance imaging ("MRI") using spatial dependence of spectral information within the magnetic field of an MRI system when such spectral information is available. Using this "spectral sensitivity" information, data acquisitions can be accelerated, for example by undersampling k-space, and clinically-viable images can be obtained in the presence of severe off-resonances.

It is an aspect of the invention to provide a method for producing an image of a subject with an MRI system that includes acquiring k-space data with the MRI system from a subject that when positioned in a magnetic field of the MRI system causes inhomogeneities in the magnetic field of the MRI system. Spectral sensitivity information is derived from the acquired k-space data. This spectral sensitivity information relates specific resonance frequencies to distinct spatial locations in the magnetic field of the MRI system. An image of the subject is then reconstructed from the acquired k-space data using the derived spectral sensitivity information to provide spatial encoding of the image.

The foregoing and other aspects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

DETAILED DESCRIPTION OF THE INVENTION

A method for accelerated magnetic resonance imaging is provided. The method makes use of spectral sensitivity in the presence of spatially dependent off-resonance to spatially encode images and permit undersampled acquisitions. As will be described below in more detail, the method of the present invention exploits the spatial dependence of off-resonance that occurs for spins precessing in the presence of magnetic field inhomogeneities to provide spatially-dependent spectral sensitivity information. This spectral sensitivity information can be used during image reconstruction to provide spatial-encoding of acquired magnetic resonance signals.

The precessional frequency of nuclear spins is proportional to the local magnetic field, $B_0$, which ideally is spatially independent, or homogeneous, over all space. When the precessional frequency remains spatially independent, spatial encoding of magnetic resonance signals can be achieved by manipulating the phase and frequency of the spins as a function of position using linear magnetic gradient fields. However, the precessional frequency is not always solely dependent on its spatial location in the magnetic field of an MRI system. Differences in magnetic susceptibility in an imaging volume result in perturbations in the $B_0$ field, also referred to as magnetic field inhomogeneities that cause spins to precess at off-resonance frequencies. For example, the magnetic susceptibility of a metallic implant is significantly different from the magnetic susceptibility of the surrounding tissue. As a result inhomogeneities in the $B_0$ field are induced, which are spatially dependent based on proximity to metal. These $B_0$ inhomogeneities change rapidly over space and cannot be compensated for with active field shimming.

Magnetic field inhomogeneities cause off-resonance of the precessional frequencies of those spins that are present in the spatially dependent magnetic field inhomogeneities. These off-resonance effects distort images acquired using conventional spatial-encoding mechanisms, which makes imaging in the presence of off-resonance difficult. For example, during frequency encoding and slice selection, the relationship between frequency of an acquired magnetic resonance signal and its spatial position becomes ambiguous. This can lead to nonlinear slice profiles as well as signal void and pile-up in areas of off-resonance.

Figure 1:
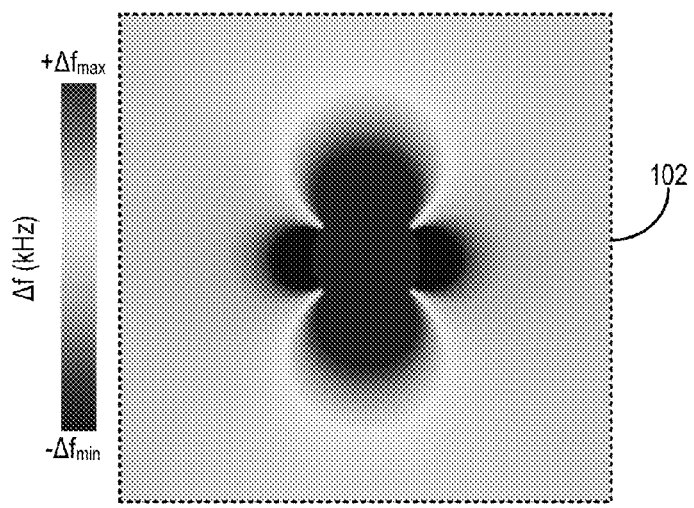
FIG. 1 is an example of a calculated magnetic field map that illustrates the magnetic field inhomogeneities produced by the presence of a metallic sphere.
Figure 2:
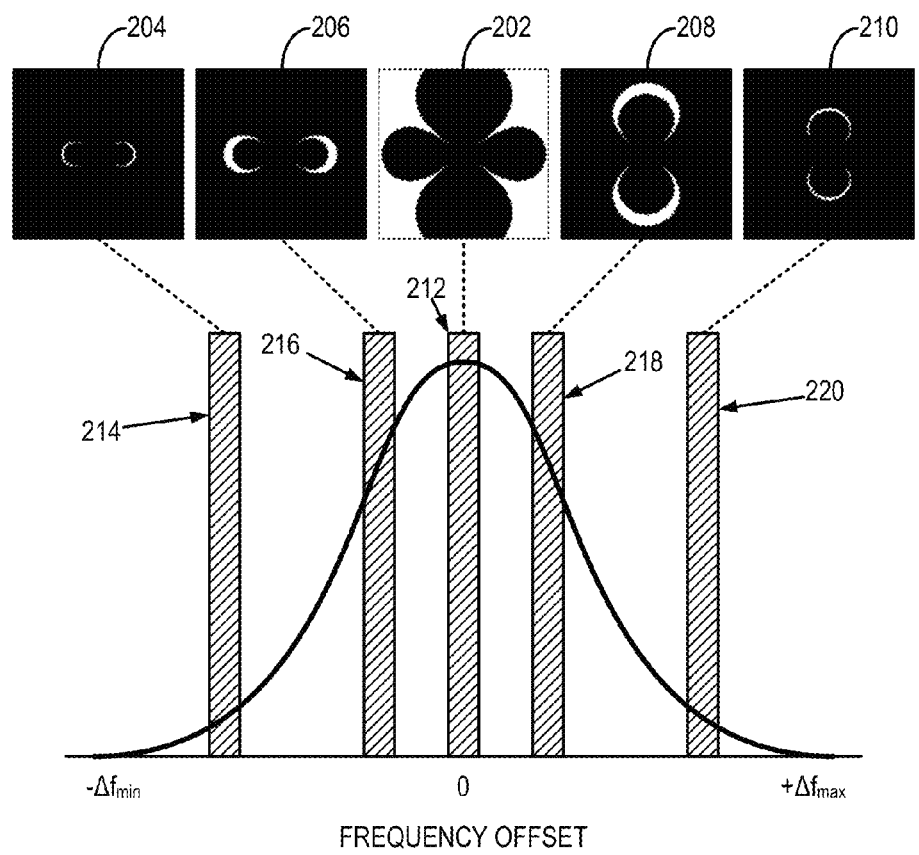
FIG. 2 is an example of an off-resonance frequency distribution and associated spectral sensitivity maps from different frequency ranges having associated spatial locations surrounding a metallic sphere.

The off-resonance produced by foreign objects, such as a metallic implant, depends on the position, size, shape, orientation, and magnetic susceptibility of the object. The off-resonance produced by these metallic objects is, therefore, spatially dependent, which allows spectral data to provide spatial encoding of an image. Referring now to FIG. 1, the spatial dependence of off-resonance is illustrated in the simulated $B_0$ field map 102 calculated in the presence of a metallic sphere, such as a titanium sphere. The magnetic field inhomogeneities generated by the presence of the titanium sphere in the $B_0$ field have a spatially-dependent spectral sensitivity that can be exhibited by depicting spectral images for distinct spectral bins. Referring now to FIG. 2, spectral sensitivity maps 202-210 for five possible different spectral bins 212-220 are illustrated. The spectral sensitivity maps, 202-210 are instructive for understanding the ability to spatially-encode magnetic resonance signals using spectral sensitivity. For example, the spectral image 202 corresponding to the resonance frequencies of spectral bin 212 depicts that the titanium sphere causes nearby frequencies to be spatially dependent. Thus, only the white regions in the periphery of the spectral image 202 will be excited by an RF pulse having the spectral characteristics of spectral bin 212. Likewise, it can be seen that spectral images 204, 206, 208, 210 each depict a unique spatial distribution of off-resonances corresponding to spectral bins 214, 216, 218, 220, respectively. The spectral sensitivity information contained in these spectral sensitivity maps can be obtained using either the direct or indirect methods described below. It is noted that the spectral sensitivity effects of the $B_0$ field inhomogeneities can be amplified or modified by applying a magnetic field gradient. By way of example, a magnetic field gradient may be applied to generate inhomogeneities in a region-of-interest that has an otherwise substantially uniform magnetic field. This may be beneficial, for example, in imaging a specific anatomy.

Each spectral image represents the signal obtained from a spatially unique portion of the image volume. The provided method for spatial-encoding using spectral sensitivity provides an ability to accelerate image acquisitions using this spatially-dependent spectral sensitivity information. Each of the spectral bin images provides spatially-dependent sensitivity information that is analogous to the sensitivity profile of an RF receiver coil. Conventional parallel imaging exploits the spatial sensitivities of independent receiver coils to accelerate acquisitions. In the presence of susceptibility-induced off-resonance, the spatial information of spectral sensitivity can also be independently exploited to accelerate acquisitions.

Figure 3:
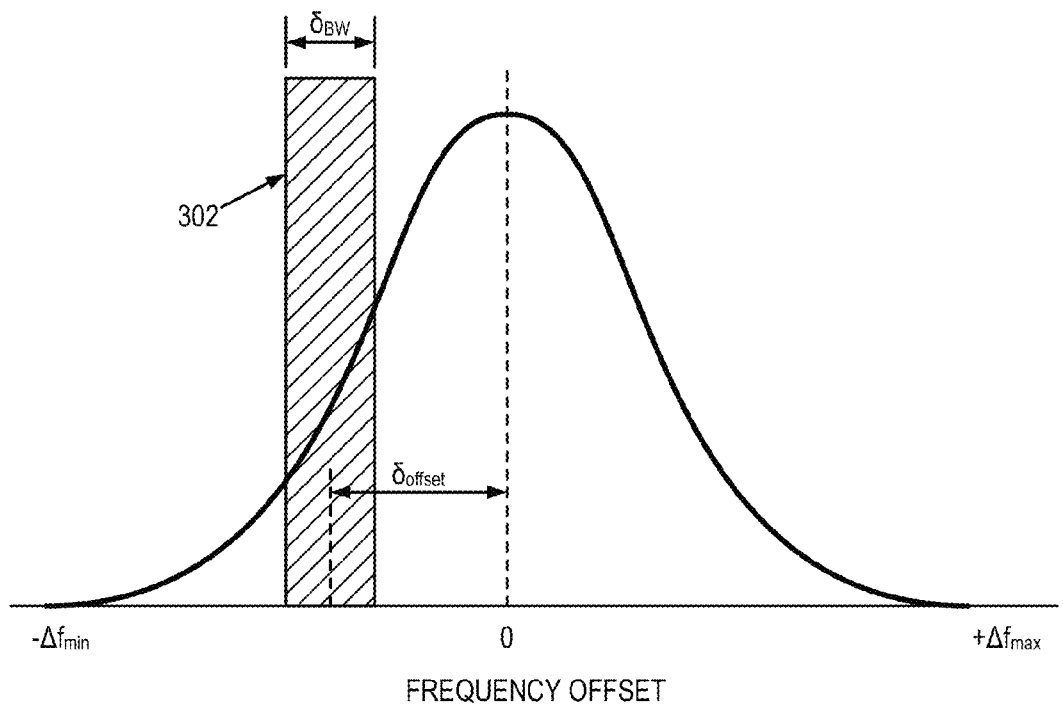
FIG. 3 is an illustration of an example spectral bin and its defining relative position and spectral bandwidth.

Referring to FIG. 3, spectral sensitivity information can be used to reconstruct magnetic resonance signals acquired from a defined frequency offset, $\delta_{offset}$, and bandwidth, $\delta_{BW}$. Together, the frequency offset, $\delta_{offset}$, and bandwidth, $\delta_{BW}$, may define a spectral bin 302. MRI pulse sequences that acquire spectral data provide images that represent magnetic resonance signals within specific spectral bins. Sensitivity to off-resonance, referred to as "spectral sensitivity," can, therefore, be achieved by one of two general spectrally-resolved methods. The first, a direct method, includes varying the center frequency of multiple RF excitations, where data from each excitation corresponds to a different spectral bin. The second, an indirect method, samples k-space at multiple time points to allow for spectral decomposition of the data. Both of these general methods generate spectral images that represent different spectral bins.

Figure 4:
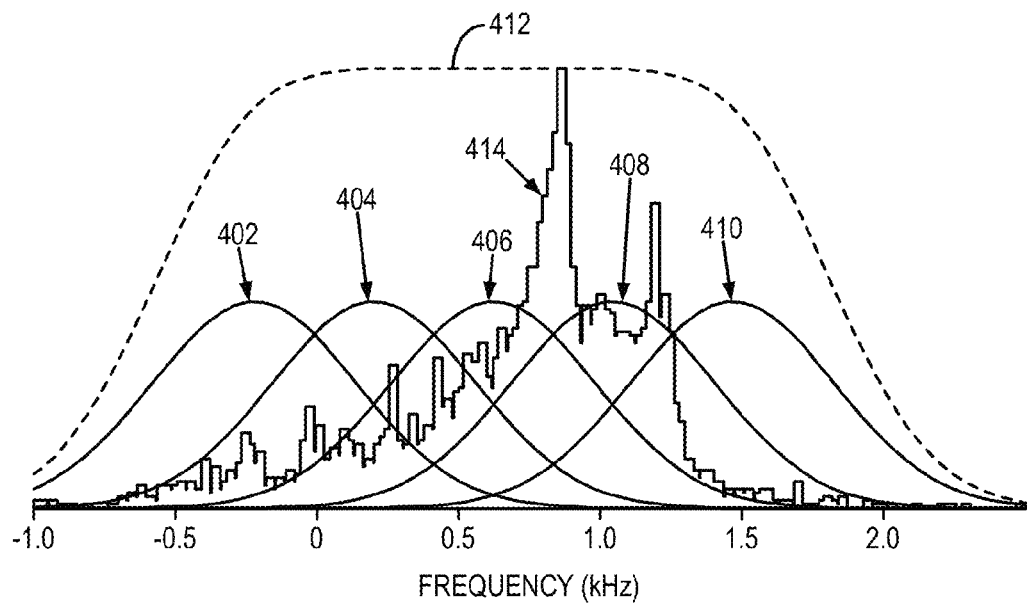
FIG. 4 is an illustration of an example of the combined spectral response (dotted line) of multiple different radio frequency excitation pulses (solid lines) each having a different center frequency to excite the full spectrum of frequencies caused by susceptibility differences.

Using direct methods, multiple acquisitions, each with a different RF center frequency, bandwidth, or both, can excite a wide spectrum of off-resonance frequencies. By way of example, and referring to FIG. 4, five different RF excitation pulses are used to excite five spectral ranges. The Gaussian spectral response profiles 402-410 for these excitation pulses provide an effective excitation over a wide band 412 of off-resonance frequencies in separate acquisitions, thereby covering the off-resonance frequency distribution 414 in this example. The off-resonance frequency distribution 414 includes the full spectrum of frequencies caused by susceptibility differences. Acquisitions using the different RF excitation pulses produce images of their respective spectral bins.

The unique spatial sensitivity of each spectral bin provides unique spatial sensitivity profiles and a mechanism to accelerate image acquisition Using indirect methods, a single range of frequencies is excited and spectral decomposition, which exploits the time dependency of the magnetic resonance signal, is used to produce spectral images depicting the off-resonance signals. For example, chemical shift imaging ("CSI") samples the free-induction decay ("FID") of each voxel in the imaging volume. Several methods exist to spectrally decompose an acquisition like CSI, including Fourier transformation along the time dimension or signal modeling using least-squares fitting, as is done in IDEAL or VARPRO. IDEAL is described, for example, by S.B. Reeder, et al., in "Multicoil Dixon Chemical Species Separation with an Iterative Least-Squares Estimation Method," *Magn. Reson. Med.,* 2004; 51(1):35-45; and VARPRO is described, for example, by D. Hernando, et al., in "Joint Estimation of Water/Fat Images and Field Inhomogeneity Map," *Magn. Reson. Med.,* 2008; 59(3):571-580. These methods produce images of spin populations at defined off-resonance frequencies, or in other words, spectral images.

It is noted that the aforementioned direct and indirect methods may be implemented separately, or may be used in combination. For example, a spectral range excited using a direct method can be further partitioned into smaller spectral bins using an indirect method.

Unlike traditional parallel imaging methods that rely on the spatial distribution of RF coil sensitivity to provide additional spatial-encoding information, the method of the present invention makes use of the spatial distribution of off-resonance frequencies caused by magnetic field inhomogeneities to provide additional spatial-encoding information. Because traditional parallel imaging methods acquire magnetic resonance signals from each RF coil simultaneously, k-space must be sampled using the same sampling pattern for each RF coil. The method of the present invention does not share this restriction when direct methods are used. Rather, when direct methods are used the method of the present invention is capable of using a different sampling pattern for different RF excitations, thereby providing more flexibility for acceleration. In addition, when an SPI scheme is used, additional flexibility in how k-space is sampled in three dimensions can be achieved. This flexibility allows for improved efficiency, signal-to-noise ratio ("SNR") performance, and artifact reduction. For example, acquiring spectral sensitivity using multiple RF offsets offers a unique k-space sampling opportunity in which each spectral bin is independently sampled. This opportunity permits spectrally variable sampling ("SVS"). For sequences using frequency encoding to spatially encode one dimension, the spatial dimensions without frequency encoding can be independently sampled. An SPI approach can provide an extension to SVS by allowing independent sampling in all three spatial dimensions. The flexibility of a SVS scheme can allow optimizations in sampling and reconstruction not otherwise possible with spectrally uniform sampling.

A sequence that utilizes spectral decomposition to achieve spectral sensitivity samples k-space identically for each spectral bin. This is analogous to the sampling restrictions of conventional parallel imaging using independent receiver coils, in which each coil inherently has an identical sampling pattern.

Figure 5:
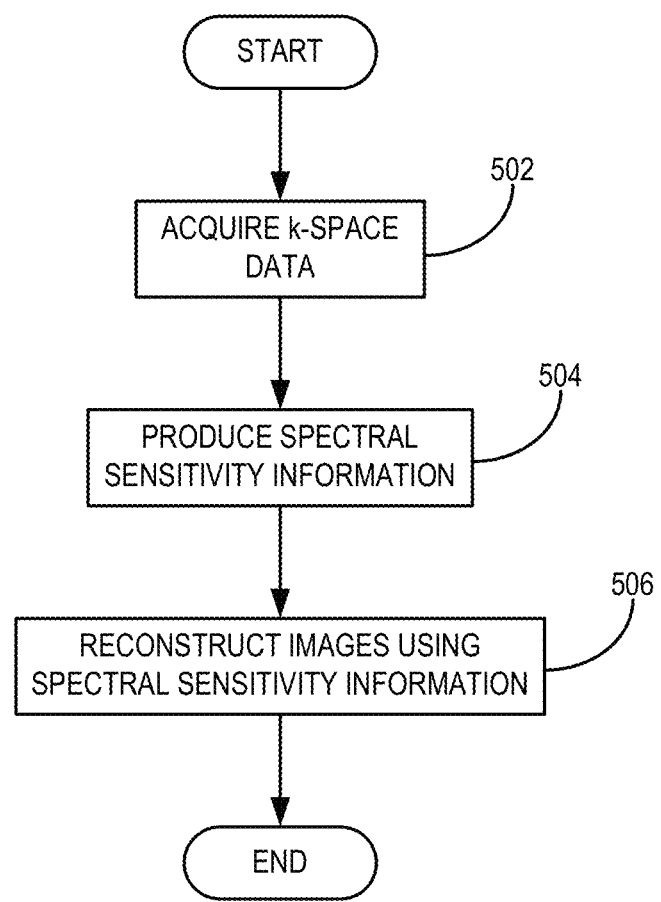
FIG. 5 is a flowchart setting forth the steps of a method for magnetic resonance imaging that makes use of spectral sensitivity information to provide spatial-encoding of magnetic resonance signals.

Referring now to FIG. 5, a flowchart setting forth the steps of an example of a method for magnetic resonance imaging that implements spatial-encoding using spectral sensitivity is illustrated. The method begins with the acquisition of k-space data, as indicated at step 502. The data acquisition may make use of a direct method for producing spectrally distinct data sets, or an indirect method for providing spatially unique signals at different resonance frequencies.

By way of example, k-space data may be acquired using a direct method, in which multiple RF excitations and subsequent data acquisitions are used to acquire k-space data that includes multiple different data sets. The multiple RF excitations may use different center frequencies, bandwidths, or both, to excite different spectral bins. In general, each different spectral bin corresponds to a range of off-resonance frequencies with a spatially unique distribution.

If an indirect method is used, k-space data is acquired using a single acquisition that excites a wide range of spectral bins that are differentiated using spectral decomposition techniques. In this instance, for a single RF excitation, spectral decomposition using the Fourier transform or a signal modeling approaches is used to decompose the acquired signals into distinct spectral bins with signals that are spatially dependent, corresponding to the off-resonance frequency distribution. The spatial uniqueness of these signals provides additional spatial information, analogous to multiple unique coil sensitivities, which can be used to accelerate the acquisition through deliberate undersampling of signal in k-space.

After k-space data has been acquired, spectral sensitivity information is produced, as indicated at step 504. By way of example, this spectral sensitivity information may be in the form of spectral sensitivity maps, or spectral images, such as those described above. A spectral sensitivity map generally depicts the spatial distribution of resonance frequencies, or off-resonance frequencies, in an image field-of-view. For example, a spectral sensitivity map may have pixels whose values indicate the spatial location of a region in the field-of-view in which spins precess at a given frequency or range of frequencies defined by a spectral bin. By way of example, the spectral sensitivity maps may be produced by reconstructing k-space data acquired using a direct method as described above, or by using a spectral decomposition technique when an indirect method as described above is used.

After the spectral sensitivity information is produced, it is used to reconstruct one or more images of the subject from the acquired k-space data, as indicated at step 506. Image reconstruction may proceed using an image reconstruction technique that traditionally makes use of coil sensitivities. By way of example, a SENSE-based reconstruction algorithm, a GRAPPA-based reconstruction algorithm, or a SPIRiT-based reconstruction algorithm may be used.

It is important to note that both direct and indirect methods do not require multiple RF coils; therefore, the method of the present invention may be practiced in conjunction with both a single channel and multichannel systems. It is also worth noting that the present invention could be used in combination with conventional parallel imaging by using multiple independent RF coils to give multiplicative acceleration factors. Although conventional parallel imaging requires multiple coils, this mechanism of acceleration for this invention is insensitive to the number of coils. In fact, a spectrally sensitive acquisition with a single coil could be accelerated using this technique. This reduces the dependency on hardware to accelerate acquisitions.

Accelerating imaging using spectral sensitivity information could also be applied to acquisitions that lack severe off-resonance but still contain multiple spectral components, such as fat-water imaging. This requires a degree of spatial separation between the chemical species, which is the case with fat in adipose tissue and wanter in non-adipose tissue. Therefore, conventional spectroscopic imaging may also benefit from this technique.

It is also contemplated that the method of the present invention may be used to accelerate a dynamic imaging acquisition in which signal varies spatially from one time frame to the next, as in dynamic contrast enhanced imaging. The temporal images can contain significant signal to calibrate a reconstruction kernel. A Fourier transform of the time dimension provides spectrally sensitive images that represent how the signal changes over time. The method of the present invention may provide a technique to reconstruct undersampled dynamic imaging sequences based on the spectrally sensitive images. This acceleration could provide either higher temporal resolution or higher spatial resolution.

Figure 6:
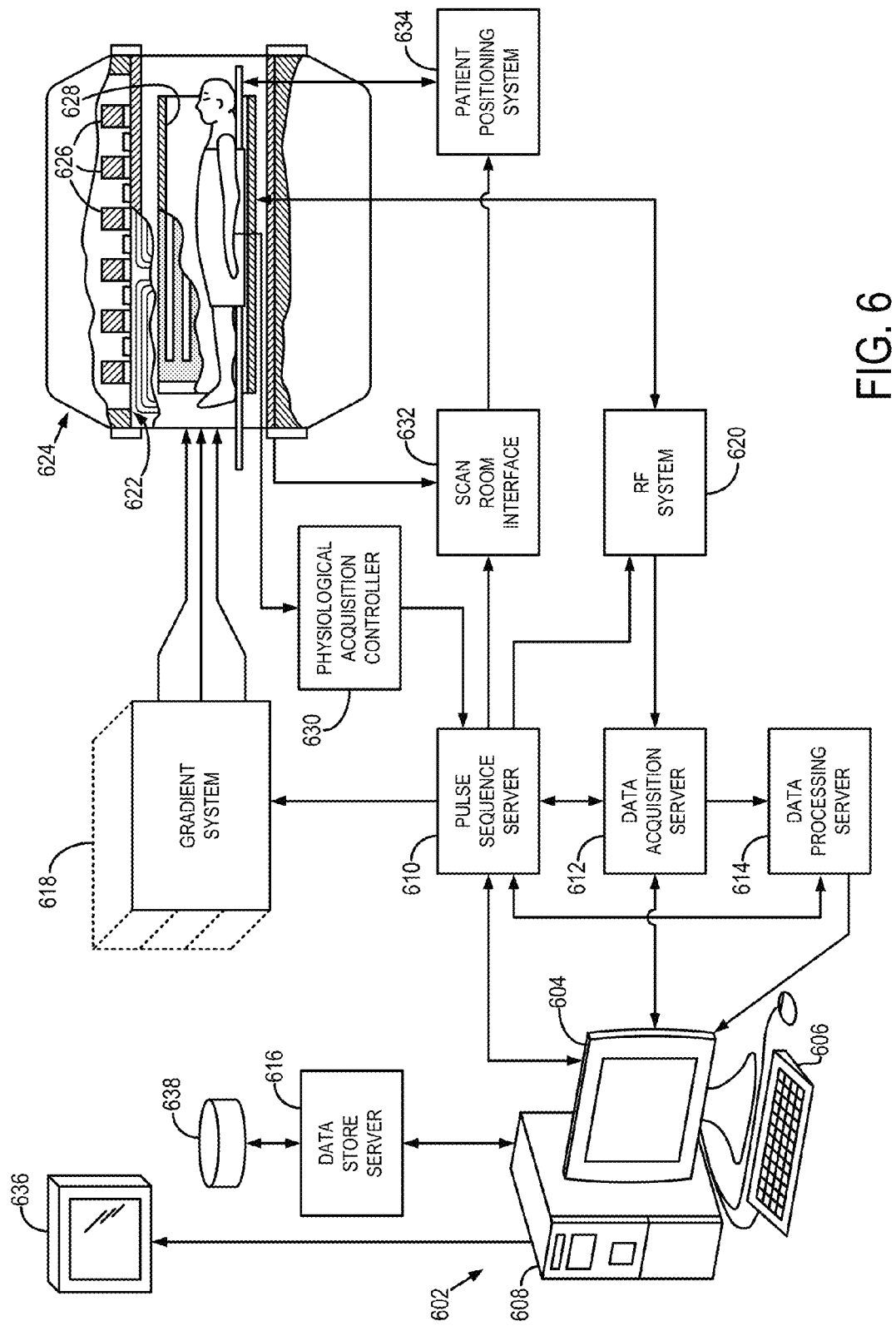
FIG. 6 is a block diagram illustrating an example of a magnetic resonance imaging system.

Referring particularly now to FIG. 6, an example of a magnetic resonance imaging ("MRI") system 600 that may implement the method of the present invention is illustrated. The MRI system 600 includes a workstation 602 having a display 604 and a keyboard 606. The workstation 602 includes a processor 608, such as a commercially available programmable machine running a commercially available operating system. The workstation 602 provides the operator interface that enables scan prescriptions to be entered into the MRI system 600. The workstation 602 is coupled to four servers: a pulse sequence server 610; a data acquisition server 612; a data processing server 614; and a data store server 616. The workstation 602 and each server 610, 612, 614, and 616 are connected to communicate with each other.

The pulse sequence server 610 functions in response to instructions downloaded from the workstation 602 to operate a gradient system 618 and a radiofrequency ("RF") system 620. Gradient waveforms necessary to perform the prescribed scan are produced and applied to the gradient system 618, which excites gradient coils in an assembly 622 to produce the magnetic field gradients $G_x$, $G_y$, and $G_z$ used for position encoding MR signals. The gradient coil assembly 622 forms part of a magnet assembly 624 that includes a polarizing magnet 626 and a whole-body RF coil 628.

RF excitation waveforms are applied to the RF coil 628, or a separate local coil (not shown in FIG. 6), by the RF system 620 to perform the prescribed magnetic resonance pulse sequence. Responsive MR signals detected by the RF coil 628, or a separate local coil (not shown in FIG. 6), are received by the RF system 620, amplified, demodulated, filtered, and digitized under direction of commands produced by the pulse sequence server 610. The RF system 620 includes an RF transmitter for producing a wide variety of RF pulses used in MR pulse sequences. The RF transmitter is responsive to the scan prescription and direction from the pulse sequence server 610 to produce RF pulses of the desired frequency, phase, and pulse amplitude waveform. The generated RF pulses may be applied to the whole body RF coil 628 or to one or more local coils or coil arrays (not shown in FIG. 6).

The RF system 620 also includes one or more RF receiver channels. Each RF receiver channel includes an RF amplifier that amplifies the MR signal received by the coil 628 to which it is connected, and a detector that detects and digitizes the I and Q quadrature components of the received MR signal. The magnitude of the received MR signal may thus be determined at any sampled point by the square root of the sum of the squares of the I and Q components:

$$M = \sqrt{I^2 + Q^2} \quad (1);$$

and the phase of the received MR signal may also be determined:

$$\varphi = \tan^{-1}\left(\frac{Q}{I}\right). \quad (2)$$

The pulse sequence server 610 also optionally receives patient data from a physiological acquisition controller 630. The controller 630 receives signals from a number of different sensors connected to the patient, such as electrocardiograph ("ECG") signals from electrodes, or respiratory signals from a bellows or other respiratory monitoring device. Such signals are typically used by the pulse sequence server 610 to synchronize, or "gate," the performance of the scan with the subject's heart beat or respiration.

The pulse sequence server 610 also connects to a scan room interface circuit 632 that receives signals from various sensors associated with the condition of the patient and the magnet system. It is also through the scan room interface circuit 632 that a patient positioning system 634 receives commands to move the patient to desired positions during the scan.

The digitized MR signal samples produced by the RF system 620 are received by the data acquisition server 612. The data acquisition server 612 operates in response to instructions downloaded from the workstation 602 to receive the real-time MR data and provide buffer storage, such that no data is lost by data overrun. In some scans, the data acquisition server 612 does little more than pass the acquired MR data to the data processor server 614. However, in scans that require information derived from acquired MR data to control the further performance of the scan, the data acquisition server 612 is programmed to produce such information and convey it to the pulse sequence server 610. For example, during prescans, MR data is acquired and used to calibrate the pulse sequence performed by the pulse sequence server 610. Also, navigator signals may be acquired during a scan and used to adjust the operating parameters of the RF system 620 or the gradient system 618, or to control the view order in which k-space is sampled. The data acquisition server 612 may also be employed to process MR signals used to detect the arrival of contrast agent in a magnetic resonance angiography ("MRA") scan. In all these examples, the data acquisition server 612 acquires MR data and processes it in real-time to produce information that is used to control the scan.

The data processing server 614 receives MR data from the data acquisition server 612 and processes it in accordance with instructions downloaded from the workstation 602. Such processing may include, for example: Fourier transformation of raw k-space MR data to produce two or three-dimensional images; the application of filters to a reconstructed image; the performance of a backprojection image reconstruction of acquired MR data; the generation of functional MR images; and the calculation of motion or flow images.

Images reconstructed by the data processing server 614 are conveyed back to the workstation 602 where they are stored. Real-time images are stored in a data base memory cache (not shown in FIG. 6), from which they may be output to operator display 612 or a display 636 that is located near the magnet assembly 624 for use by attending physicians. Batch mode images or selected real time images are stored in a host database on disc storage 638. When such images have been reconstructed and transferred to storage, the data processing server 614 notifies the data store server 616 on the workstation 602. The workstation 602 may be used by an operator to archive the images, produce films, or send the images via a network to other facilities.

In summary, a method for accelerating magnetic resonance imaging using spectral sensitivity has been provided. The method is insensitive to both the position and spatial extent of off-resonance, allows spectrally variable k-space sampling when using direct methods for spectrally resolving the magnetic resonance signals, and is insensitive to the hardware constraints of multiple independent RF coils needed for conventional parallel imaging. The acceleration enabled by the method of the present invention may reduce scan times of both multi-RF acquisitions and spectrally-resolved, fully phase-encoded acquisitions using the SPI method cited above, to clinically acceptable scan times.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing an image of a subject with a magnetic resonance imaging (MRI) system, the steps of the method comprising:
   a) acquiring k-space data with an MRI system from a subject, wherein when the subject is positioned in a magnetic field of the MRI system the subject causes inhomogeneities in the magnetic field of the MRI system;
   b) deriving spectral sensitivity information from the acquired k-space data, wherein the spectral sensitivity information relates specific resonance frequencies to distinct spatial locations in the magnetic field of the MRI system based on the inhomogeneities in the magnetic field of the MRI system that are caused by the subject being positioned in the magnetic field;
   c) reconstructing an image of the subject from the acquired k-space data using the spectral sensitivity information produced in step b) to provide spatial encoding of the image.

2. The method as recited in claim 1 in which step b) includes producing a plurality of spectral sensitivity maps from the acquired k-space data, each of the plurality of spectral sensitivity maps depicting spatial locations within an imaging field-of-view that are associated with a particular spectral response.

3. The method as recited in claim 2 in which the particular spectral response is a range resonance frequencies that are off-resonance because of the inhomogeneities in the magnetic field of the MRI system.

4. The method as recited in claim 1 in which step a) includes:
   i) applying a radio frequency (RF) excitation pulse having a center frequency and a spectral bandwidth;
   ii) acquiring a k-space data set following the application of the RF excitation pulse; and
   iii) repeating steps a)i) and a)ii) a plurality of times to acquire the k-space data while changing at least one of the center frequency and the spectral bandwidth of the RF excitation pulse during each repetition of step a)i).

5. The method as recited in claim 4 in which step b) includes reconstructing a spectral sensitivity map from each k-space data set acquired in step a)ii); and
   wherein each spectral sensitivity map depicts spatial locations within an imaging field-of-view that are associated with resonance frequencies in a spectral band defined by the center frequency and spectral bandwidth of the RF excitation pulse associated with the k-space data set from which the spectral sensitivity map was reconstructed.

6. The method as recited in claim 4 in which each repetition of step a)ii) includes sampling k-space with a different sampling pattern.

7. The method as recited in claim 6 in which the different sampling pattern is selected to sample k-space locations having spatial frequency values corresponding to spectral frequencies in a spectral bin defined by the center frequency and spectral bandwidth of the RF excitation pulse associated with the k-space data set being acquired.

8. The method as recited in claim 4 in which step b) includes reconstructing a plurality of spectral sensitivity maps from the k-space data acquired in step a) using a spectral decomposition algorithm.

9. The method as recited in claim 1 in which step b) includes reconstructing a plurality of spectral sensitivity maps from the k-space data acquired in step a) using a spectral decomposition algorithm.

10. The method as recited in claim 1 in which the subject contains an object having a magnetic susceptibility such that when the object is positioned in the magnetic field of the MRI system the inhomogeneities in the magnetic field of the MRI system are generated.

11. The method as recited in claim 1 in which step a) includes applying a magnetic field gradient to the magnetic field of the MRI system to modify the inhomogeneities in the magnetic field of the MRI system that are caused by the subject being positioned in the magnetic field.

12. The method as recited in claim 11 in which step a) includes applying the magnetic field gradient to amplify the inhomogeneities in the magnetic field of the MRI system.

13. The method as recited in claim 1 in which step a) includes applying a magnetic field gradient to the magnetic field of the MRI system to generate inhomogeneities in the magnetic field of the MRI system in a region-of-interest that has a substantially uniform magnetic field.

14. The method as recited in claim 1 in which the k-space data acquired in step a) is acquired during a time period and is indicative of a time series of images, and in which the spectral sensitivity information produced in step b) relates resonance frequencies changing at a temporal frequency during the time period with spatial locations in the magnetic field of the MRI system.

15. The method as recited in claim 1 in which at least two of the distinct spatial locations in the magnetic field of the MRI system that are related to the specific resonance frequencies overlap each other.

16. The method as recited in claim 1 in which the k-space data acquired in step a) is acquired by undersampling k-space.

* * * * *